(12) United States Patent
Carminati et al.

(10) Patent No.: US 10,101,578 B2
(45) Date of Patent: Oct. 16, 2018

(54) MICRO-ELECTRO-MECHANICAL DEVICE HAVING A TILTABLE STRUCTURE, WITH DETECTION OF THE POSITION OF THE TILTABLE STRUCTURE

(71) Applicant: STMICROELECTRONICS S.R.L., Agrate Brianza (IT)

(72) Inventors: Roberto Carminati, Piancogno (IT); Enri Duqi, Milan (IT); Sebastiano Conti, Pregnana Milanese (IT)

(73) Assignee: STMICROELECTRONICS S.R.L., Agrate Brianza (IT)

(*) Notice: Subject to any disclaimer, the term of this patent is extended or adjusted under 35 U.S.C. 154(b) by 0 days.

(21) Appl. No.: 15/368,184

(22) Filed: Dec. 2, 2016

(65) Prior Publication Data

US 2018/0003950 A1 Jan. 4, 2018

(30) Foreign Application Priority Data

Jun. 30, 2016 (IT) .................. 102016000068007

(51) Int. Cl.
*H04N 3/08* (2006.01)
*G02B 26/08* (2006.01)
*B81B 3/00* (2006.01)
*H04N 9/31* (2006.01)

(52) U.S. Cl.
CPC ........ *G02B 26/0833* (2013.01); *B81B 3/0045* (2013.01); *H04N 9/3155* (2013.01); *H04N 9/3173* (2013.01); *B81B 2201/042* (2013.01); *B81B 2203/0315* (2013.01); *B81B 2203/056* (2013.01)

(58) Field of Classification Search
CPC . B81B 3/0045; G02B 26/0833; H04N 9/3155
USPC ........ 348/203, 195, 201, 202, 744; 356/138, 356/139.07, 139.05; 359/201.1, 203.1
See application file for complete search history.

(56) References Cited

U.S. PATENT DOCUMENTS

| 6,249,346 B1* | 6/2001 | Chen ..................... G01J 3/02 356/328 |
| 2002/0071169 A1 | 6/2002 | Bowers et al. |
| 2014/0063484 A1 | 3/2014 | Tauro et al. |

FOREIGN PATENT DOCUMENTS

| JP | 2003-43382 A | 2/2003 |
| JP | 2015-184337 A | 10/2015 |

* cited by examiner

*Primary Examiner* — Michael Lee
*Assistant Examiner* — Jean W Desir
(74) *Attorney, Agent, or Firm* — Seed IP Law Group LLP (57) ABSTRACT

A micro-electro-mechanical device, wherein a platform is formed in a top substrate and is configured to turn through a rotation angle. The platform has a slit and faces a cavity. A plurality of integrated photodetectors is formed in a bottom substrate so as to detect the light through the slit and generate signals correlated to the light through the slit. The area of the slit varies with the rotation angle of the platform and causes diffraction, more or less marked as a function of the angle. The difference between the signals of two photodetectors arranged at different positions with respect to the slit yields the angle.

20 Claims, 6 Drawing Sheets

MICRO-ELECTRO-MECHANICAL DEVICE HAVING A TILTABLE STRUCTURE, WITH DETECTION OF THE POSITION OF THE TILTABLE STRUCTURE

BACKGROUND

Technical Field

The present disclosure relates to a micro-electro-mechanical device having a tiltable structure. In particular, hereinafter reference will be made to a micromirror obtained through the MEMS (Micro-Electro-Mechanical Systems) technology, without any loss of generality.

Description of the Related Art

Micro-electro-mechanical devices are known having a mirror structure using semiconductor technology.

These micro-electro-mechanical devices are, for example, used in portable apparatuses, such as portable computers, laptops, notebooks (including ultra-thin notebooks), PDAs, tablets, cellphones, smartphones, etc., for optical applications, in particular for directing light beams generated by a light source according to desired modalities.

Thanks to the small dimensions, the above devices enable stringent standards to be met as regards space occupation, both as to area and thickness.

For example, micro-electro-mechanical mirror devices are used in miniaturized projector modules (so-called picoprojectors), which are able to project images at a distance or to generate desired patterns of light.

Micro-electro-mechanical mirror devices generally include a mirror element suspended over a cavity and formed starting from a body of semiconductor material so as to be mobile, typically with movements of tilting or rotation, for directing the incident light beam as desired.

Figure 1:
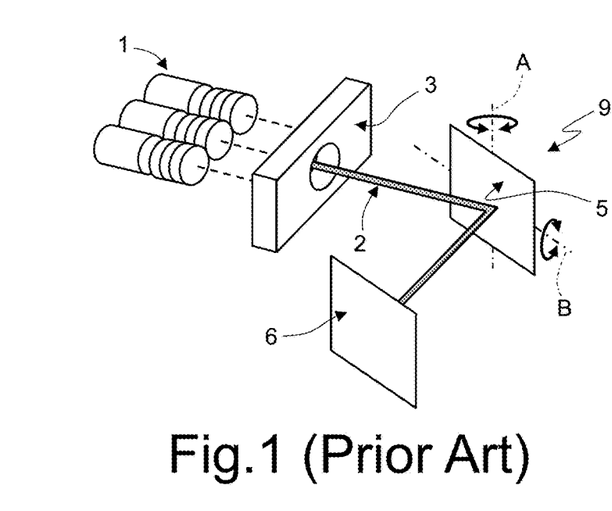
FIG. 1 is a schematic representation of a picoprojector.
Figure 2:
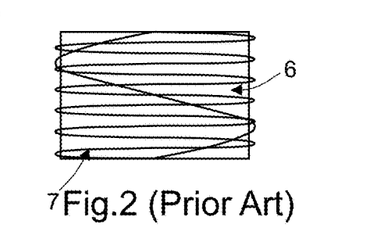
FIG. 2 shows the projection scheme of an image generated by the picoprojector of FIG. 1 on a screen.

For example, FIG. 1 is a schematic representation of a picoprojector 9 comprising a light source 1, typically a laser source, generating three monochromatic beams, one for each base color, which, through an optical system 3 represented only schematically, become a light beam 2 that is deflected by a mirror element 5 towards a screen 6. In the example shown, the mirror element 5 is of a two-dimensional type, controlled so as rotate about a vertical axis A and a horizontal axis B. Rotation of the mirror element 5 about the vertical axis A generates a fast horizontal scan, as shown in FIG. 2. Rotation of the mirror element 5 about the horizontal axis B, perpendicular to the vertical axis A, generates a slow vertical scan, typically of a sawtooth type.

The obtained scanning scheme is shown in FIG. 2 and designated by 7.

In a variant of the system of FIG. 1, the picoprojector comprises two micromirrors, arranged in sequence along the path of the light beam 2 and each rotatable about an own axis, and precisely one rotatable about the horizontal axis B and the other rotatable about the vertical axis A, for generating the same scanning scheme as in FIG. 2.

Another application of micromirror systems is in 3D gesture-recognition systems. These normally use a picoprojector and an image-acquisition device, such as a photographic camera. The light beam here may be in the range of visible light, of invisible light, or at any useful frequency. The picoprojector may be similar to the picoprojector 9 of FIG. 1, and the light beam 2 deflected by the micromirror 5 is used for scanning an object in two directions. For example, the picoprojector may project small stripes or bands on the object. Any possible projecting or recessed areas of the object (due to the depth thereof) create deformations in the light rays detected by the photographic camera, which may be processed by suitable electronics for detecting the third dimension.

In both cases, with the considered technology, the picoprojector comprises a mirror element, rotation whereof is generally controlled via an actuation system, currently of an electrostatic, magnetic, or piezoelectric type.

Figure 3:
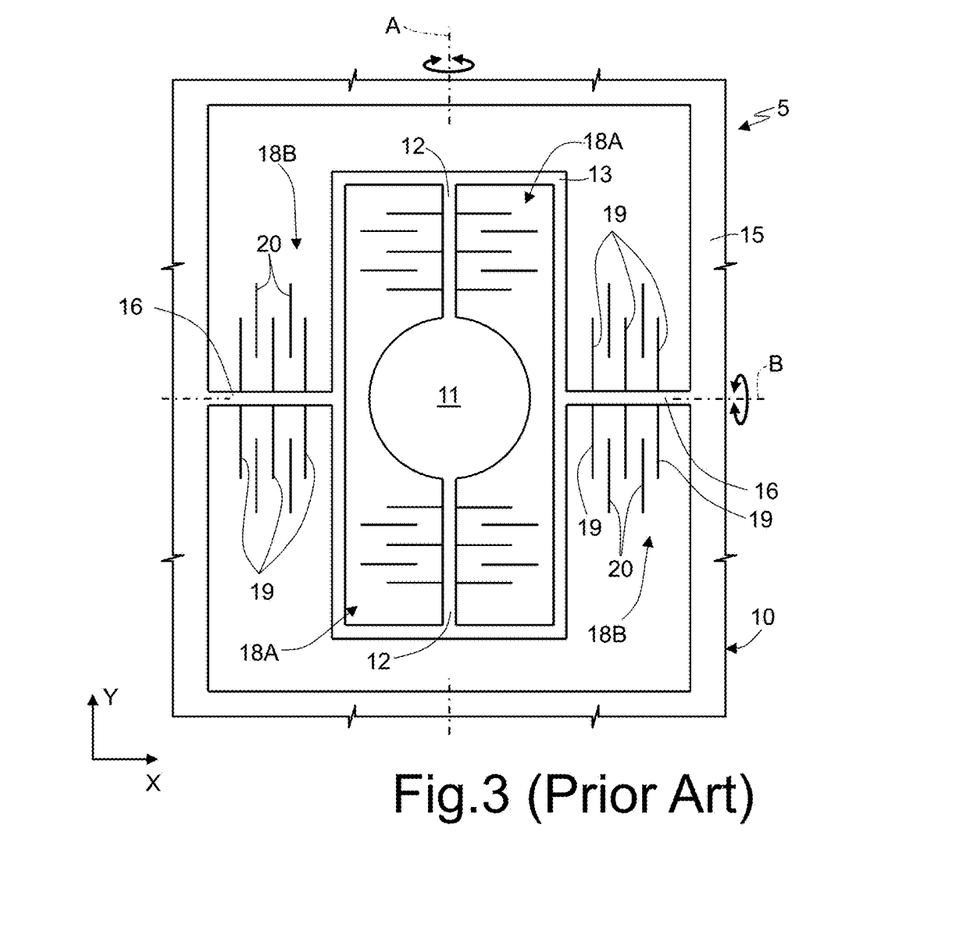
FIG. 3 is a top plan view of a microelectronic micromirror device with electrostatic actuation.

For example, FIG. 3 shows a mirror element 5 with purely electrostatic actuation. Here, a chip 10 comprises a region 11 suspended over a substrate (not visible), having a reflecting surface (not shown) and supported by a suspended frame 13 by a first pair of arms 12 (first torsion springs). The first arms 12 extend from opposite sides of the suspended region 11 and form the rotation axis A of the mirror element 5. The suspended frame 13 is connected to a fixed peripheral portion 15 of the chip 10 via a second pair of arms 16 (second torsion springs), which enable rotation of the suspended frame 13 and of the suspended region 11 about the horizontal axis B. The first and second arms 12, 16 are coupled to respective actuation assemblies 18A, 18B of an electrostatic type. Each actuation assembly 18 A, 18B here comprises first electrodes 19 facing respective second electrodes 20.

In detail, the first electrodes 19 are fixed with respect to the respective arms 12, 16 and are comb-fingered with respect to the second electrodes 20 for generating a capacitive coupling. Due to the arrangement of the electrodes 19, 20 of each actuation assembly 18A, 18B, the driving structure is also defined as "comb drive structure".

By applying appropriate voltages between the first electrodes 19 and the second electrodes 20, it is possible to generate attraction/repulsion forces between them and thus cause rotation of the first electrodes 19 with respect to the second electrodes 20 and torsion of the arms 12, 16 about the respective axes A, B. Thereby, controlled rotation of the suspended region 11 with respect to axes A, B, and thus scanning in a horizontal direction and in a vertical direction, are obtained.

Rotation of the mirror element 5 about the vertical axis A that produces the horizontal scan occurs generally through an angle of $\pm 12°$, and rotation of the mirror element 5 about the horizontal axis B that produces the vertical scan occurs generally through an angle of $\pm 8°$.

To function properly, it is desirable for the angular position of the mirror element to be controlled precisely. In fact, minor deviations of the physical or electrical characteristics of the structures, due to the variability in the production lots, to assembly imprecision, or to variable operating conditions, such as temperature or ageing, may lead to even considerable errors in the direction of the light beam emitted by the mirror element.

To this end, systems for detecting the position of the micromirror element are known in the art, based upon capacitive or piezoelectric principles.

However, known solutions are not completely satisfactory. In particular, solutions of a capacitive type are markedly non-linear with the angle, so that signal processing is in general complex and burdensome for the processing electronics. Solutions of a piezoelectric type employ, on the other hand, temperature compensation, which adds complexity to the system and in turn introduces a source of error.

BRIEF SUMMARY

One embodiment of the present disclosure is a micro-electro-mechanical device that includes:

a platform configured to turn by a rotation angle (θ);

a slit in the platform;

a support structure supporting the platform and including a cavity facing a first side of the platform; and a plurality of integrated photodetectors facing the cavity and the first side of the platform.

BRIEF DESCRIPTION OF THE SEVERAL VIEWS OF THE DRAWINGS

For a better understanding of the present disclosure, preferred embodiments thereof are now described, purely by way of non-limiting example, with reference to the attached drawings, wherein.

DETAILED DESCRIPTION

In the following description, for simplicity, embodiments will be described where the micromirror is rotatable only about one axis. However, it may be modified in a simple way for detection of rotations about two axes, as explained hereinafter.

Figure 4:
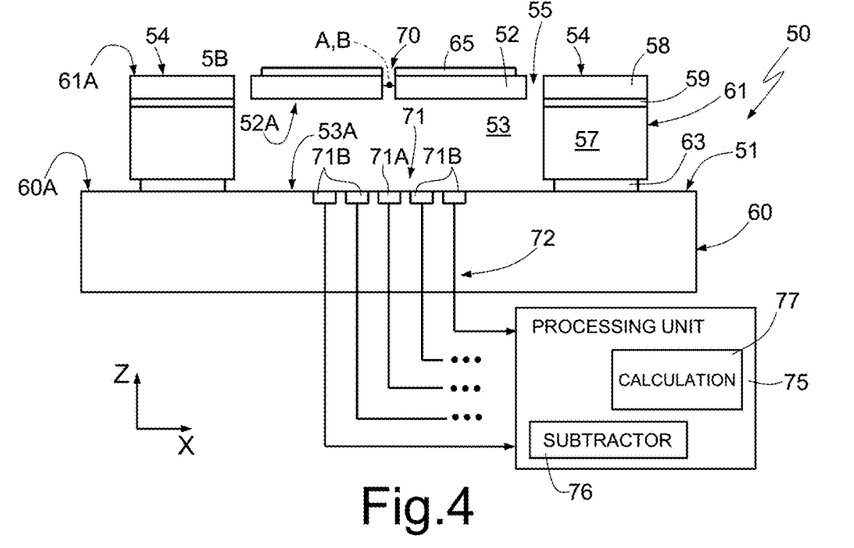
FIG. 4 is a cross-section of a micro-electro-mechanical micromirror device having a system for detecting the angular position of a platform of the device.
Figure 5:
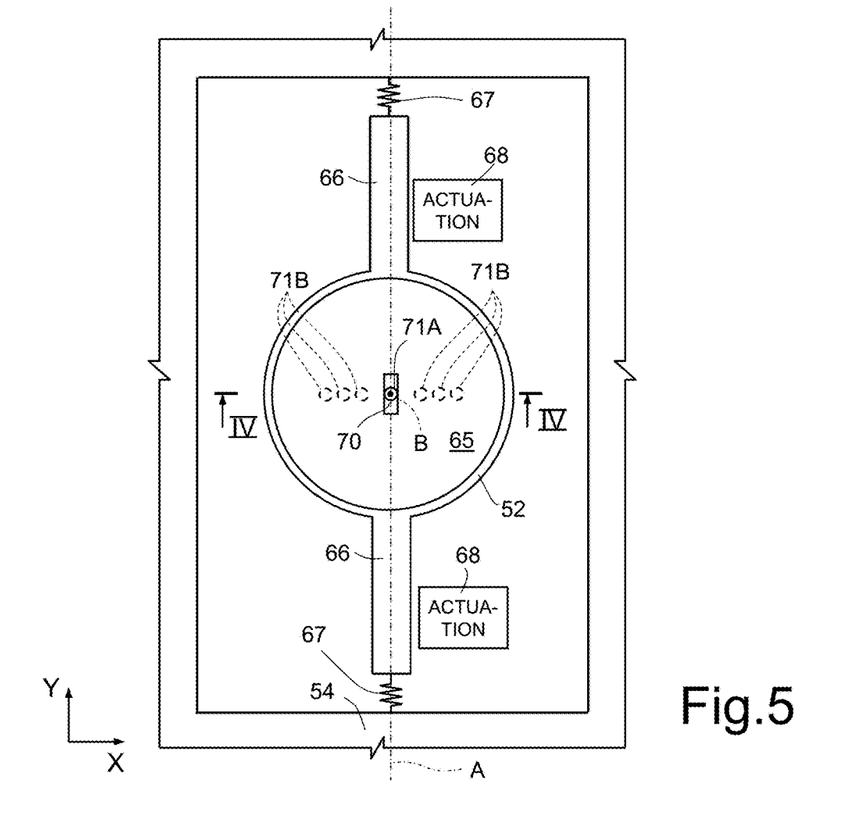
FIG. 5 is a top plan view of a part of the micro-electro-mechanical device of FIG. 4.

FIGS. 4 and 5 are schematic illustrations of a microelectronic device 50 having a tiltable structure (platform 52), which is able to turn about a rotation axis A. The platform 52 is suspended over a cavity 53, formed in a carrying structure 51 and is completely laterally surrounded by a through trench 55.

The microelectronic device 50 is formed in a first substrate 60 and in a second substrate 61, here bonded to each other by an adhesive layer 63, for example of silicon oxide, glass frit, or other bonding material normally used in MEMS. The substrates 60 and 61 may be obtained starting from two wafers of semiconductor material, for example silicon, using known semiconductor manufacture techniques, such as trenching, growing, selective depositing and/or removing, and sawing, in a per known manner. For example, the second substrate 61 may be formed from an SOI (Silicon-On-Insulator) substrate, and comprises two semiconductor layers (and precisely a bottom semiconductor layer 57 and a top semiconductor layer 58) separated by an insulating layer 59. The bottom semiconductor layer 57 is partially removed to form the cavity 53, and the top semiconductor layer 58 is defined to form the trench 55 surrounding the platform 52.

The carrying structure 51 is thus formed by the first substrate 60, which delimits the cavity 53 at the bottom, and by walls 54, which delimit the cavity 53 and the through trench 55 laterally and are formed by the second substrate 61. The cavity 53 thus has a bottom surface 53A, lying in the same plane as the top surface 60A of the first substrate 60. Further, the second substrate 61 has a top surface 61A parallel to the top surface 60A of the first substrate 60.

The platform 52 has a first side 52a facing the cavity 53 and a top surface (second side 52B) which is the same, in the rest position, with the top surface of the second substrate 61 and carries a reflecting layer 65, for example a metal layer. The platform 52 is supported by the carrying structure 51 through a supporting and actuation structure, which is also formed in the top semiconductor layer 58 of the second substrate 61 and comprises (see in particular FIG. 5) arms 66, torsion springs 67, represented only schematically, and an actuation structure 68, also represented only schematically and formed in any known way, for example of an electrostatic, piezoelectric, or magnetic type.

In the embodiment shown, the platform 52 and the reflecting layer 65 have a circular shape. They could, however, have any other shape, for example quadrangular, hexagonal, etc., and have their center of mass B along the rotation axis A.

The platform 52 and the reflecting layer 65 have a slit 70, preferably arranged in a central position (for example centered on the center of mass B), extending completely through them. The slit 70 has relatively small dimensions so as to intercept a small portion of the light beam impinging upon the reflecting surface 65. For example, the slit 70 may have a roughly rectangular shape with major side parallel to the rotation axis A, as visible in particular in FIG. 5. Other shapes or directions are, however, possible. For instance, the slit 70 may have dimensions comprised between 1 μm×10 μm and 5 μm×50 μm, for example, 3 μm×20 μm. The slit 70 has a bottom output edge 70A facing the bottom surface 53A of the cavity 53.

The second substrate 60 carries an array of photodetectors 71, for example photodiodes, preferably integrated in the semiconductor material of the second substrate 60 and facing the cavity 53. The photodetectors 71 are manufactured in any known way and are arranged underneath the slit 70, for example so that the center of the array is vertically aligned with the center of the slit 70 and the center of mass B. As shown schematically in FIG. 5, the photodetectors 71 may be aligned to each other in a direction perpendicular to the rotation axis A and parallel to the direction of the long side of the slit 70 (direction Y), or arranged in different configurations, as discussed in detail hereinafter with reference to FIGS. 9-12.

In particular, in FIGS. 4 and 5, the array of photodetectors 71 comprises a central photodetector 71A arranged along the vertical line through the center of the slit 70 and a plurality of lateral photodetectors 71B arranged at an increasing distance from the central photodetector 71A.

The photodetectors 71 are connected, through conductive paths 72 represented only schematically, and appropriate interfaces (not shown), to a processing unit 75, which is, for example, arranged in a separate read interface, for instance an ASIC (Application Specific Integrated Circuit). Alternatively, the processing unit 75 may be formed in the first substrate 60.

The processing unit 75 receives the electrical signals generated by the photodetectors 71 and processes them to obtain the rotation angle of the platform 52, as explained hereinafter. To this end, the processing unit 75 comprises a subtractor 76 and a computing unit 77, represented schematically.

The micro-electro-mechanical device 50 exploits the known phenomenon of diffraction whereby the width of the spot generated on a wall in front of a slit passed by a wave is inversely proportional to the amplitude of the slit, and to very small slits there correspond very wide diffraction fringes.

Figure 6A:
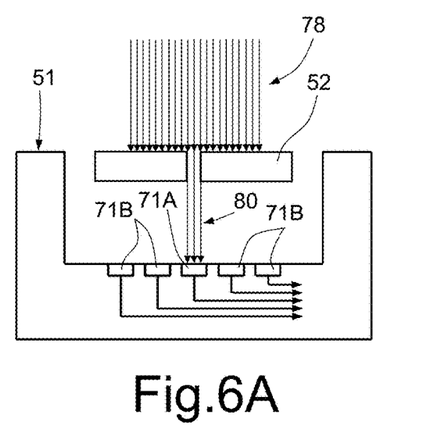
FIGS. 6A and 6B show the structure of FIG. 4 in a simplified way and in two different operating positions.
Figure 6B:
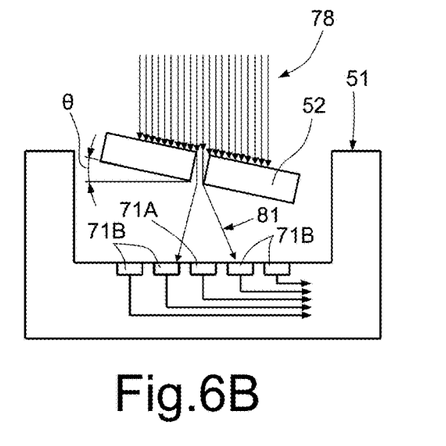

This phenomenon is represented in a simplified way in FIGS. 6A and 6B (where the secondary peaks are ignored), which are schematic illustrations of the microelectronic device 50 in two rotation positions, in the operating hypothesis that the platform 52 is impinged upon by light beam directed perpendicular to the top surface 60A, 60B of the first and second substrates 60, 61. The light beam, represented schematically and designated by 78, is, for example, generated by a light source, such as the light source 1 of FIG. 1.

In detail, FIG. 6A shows the microelectronic device 50 with the platform 52 in the rest position (i.e., not tilted). Thus, the top surface 52B of the platform 52 and the reflecting layer 65 are arranged parallel to the top surface 53A of the cavity 53 (angle 0°).

In this position, the light beam 78 is perpendicular also to the platform 52 and thus passes through the slit 70 over its entire area (area of the slit 70 visible from above, in FIG. 5). The width of the light beam 80 that reaches the array of photodetectors 71 (arranged in this case as shown in FIG. 5) here has a first width, which is roughly the same as the area of the slit 70, but for diffraction and reflection phenomena, here substantially negligible. As mentioned, in any case, the small area of the slit 70 is such that only a very small portion of the light beam passes through the slit 70 and is thus "lost" for the operation of the micro-electro-mechanical device 50 as a micromirror (in other words, practically all the light beam 78 is reflected by the reflecting surface 65). In this way, there is no marked reduction of the efficiency of the micro-electro-mechanical device 50.

During rotation of the platform 52, as the angle θ of rotation increases, the "useful" area of the slit 70 (i.e., the projection of the area of the slit 70 in a plane parallel to the top surface 61A of the first substrate 61) decreases, as shown in FIG. 6B for a rotation of approximately 10°. Further, a part of the light entering the slit 70 is reflected on the walls of the slit 70 and is scattered in various directions due to the roughness of the walls so that the width of the light beam 81 leaving the slit 70 is further reduced as compared to that of the incoming light beam. Consequently, as the rotation angle θ of the platform 52 increases, the width of the light beam 81 decreases at the bottom output edge 70A of the slit 70. It follows that the light beam 81 exiting from the slit 70 widens and, in FIG. 6B, reaches an area, on the bottom surface 53A of the cavity 53, much greater than the width for a zero rotation angle of the platform 52 (FIG. 6A).

Thus, as the rotation angle θ increases, a larger number of photodetectors 71B of the array is reached by the light beam 81, but the intensity of the light detected by these decreases.

Figure 7:
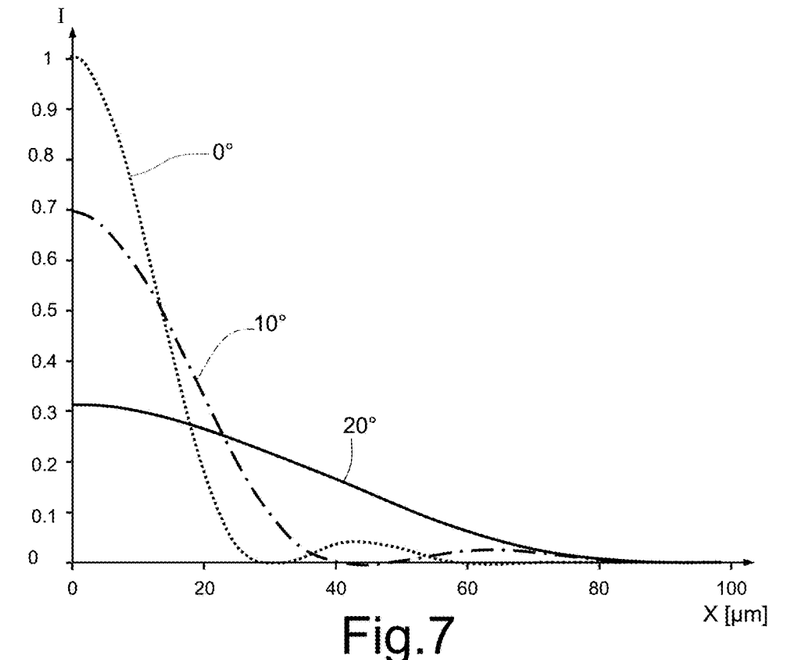
FIGS. 7 and 8 are plots of electrical signals of the device of FIG. 4.

The above behavior is visible also from the plots of FIG. 7, showing the normalized light intensity I, detected by the photodetectors 71A, 71B, for three different values of the rotation angle θ of the platform 52, as a function of the distance X of the lateral photodetectors 71B from the central photodetector 71A.

As may be noted, in non-tilted position of the platform 52 (angle θ=0°, dotted curve 100) the light intensity I is maximum at the central photodiode 70A (on the graph, normalized to 1) and drops very rapidly as the distance from the central photodetector 71A increases. The light intensity I drops practically to zero in the lateral photodetectors 70B arranged at a distance of almost 30 μm from the central photodiode 70A and then increases slightly again as a result of the side bands due to diffraction.

For a rotation angle θ=10° (dashed and dotted curve 110), the light intensity I detected by the central photodetector 71A decreases to 70% of the maximum value, but the light intensity I detected by the lateral photodetectors 71B decreases more slowly as their distance from the central photodetector 71A increases, as compared to the curve 100. Thus, a larger number of lateral photodetectors 71B detects a light intensity I of non-zero amplitude.

For a rotation angle θ=20° (solid curve 120), the light intensity I detected by the central photodetector 71A is very low (approximately 30% of the maximum value), but the width of the light beam 78 is much greater than for the curves 100 and 120, and the light intensity I detected by the lateral photodetectors 71B decreases very slowly with the distance, so that a still larger number of lateral photodiodes 70B is reached by a light intensity I of a measurable value.

The value of the light intensity I detected by the photodetectors 71 and its reduction rate in the lateral photodetectors 71B may thus be used as a measure of the rotation angle θ of the platform 52.

Studies conducted by the applicant have further shown that the signals supplied by the photodetectors 71 may provide a direct and unique indication of the rotation angle θ of the platform 52. In particular, it has been shown that an optimal position of the photodetectors 71 exists where the measured light intensity signal is uniquely linked to the value of the rotation angle θ of the platform 52. In particular, it has been shown that a position X exists where the difference between the light intensity signal $I_C(0,\theta)$ supplied by the central photodetector 71A, and the light intensity signal $I_L(x,\theta)$, supplied by the lateral photodetector 71B arranged at a distance X from the central photodetector 71A, is directly proportional to the rotation angle θ of the platform 52, as discussed hereinafter.

To this end, let us assume that the array of photodiodes 70 comprises M elements, and the signal of light intensity I generated by them is acquired at K discrete angles $\theta_i$. In this way, M×K values are acquired corresponding to the measured light intensity I.

In particular, if $I_{Ci}(0,\theta_i)$ is the value of the signal of light intensity supplied by the central photodetector 71A at a generic angle $\theta_i$ and $I_{Lji}(x_j,\theta_i)$ the value of the light intensity signal supplied by the generic lateral photodetector $70B_j$ arranged at a distance $x_j$ for the generic angle $\theta_i$, M×K values are obtained. From these, it is possible to calculate N=(M−1)×K values of a difference function:

$$DI_{ji}(x_j,\theta_i)=I_{Lji}(x_j,\theta_i)-I_{Ci}(0,\theta_i).$$

In order to evaluate the linearity of this function, the square of the correlation coefficient r is used, which may be computed for a set of data $(z_i, y_i)$ as:

$$r^2 = \frac{\left(N\sum(z_iy_i) - \sum z_i \sum y_i\right)^2}{[N\sum(z_i^2) - (\sum z_i)^2][N\sum(y_i^2) - (\sum y_i)^2]}. \quad [1]$$

In the specific case, the angle $\theta_i$ represents the variable $z_i$ and the difference function $DI_{ji}(x_j,\theta_i)$ represents the variable $y_i$. Eq. [1] may thus be rewritten as:

$$L^2 = \frac{(N\sum(\theta_i DI_{ij}) - \sum \theta_i \sum DI_{ij})^2}{[N\sum(\theta_i^2) - (\sum \theta_i)^2][N\sum(DI_{ij}^2) - (\sum DI_{ij})^2]}. \quad [2]$$

Figure 8:
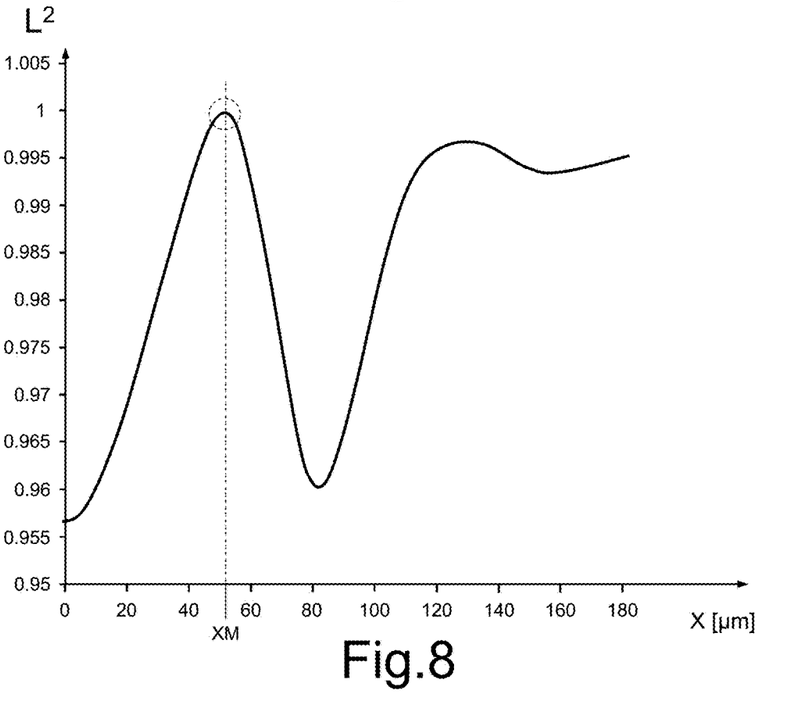

The value of the parameter $L^2$ as a function of the position x of the lateral photodetectors 70B is represented in FIG. 8 on the basis of simulations conducted by the present applicant.

As may be noted, the curve of the linearity $L^2$ shows that there least one point exists (at a distance XM, in the graph approximately 52 μm) where the curve has the value 1 and thus a linear correlation exists between the light intensity difference DI and the angle θ. Consequently, the difference between the light intensity measured in the lateral photodetector 71B at a distance XM from the central photodetector 71A and the light intensity measured in the central photodetector 71A is directly proportional to the angle θ, according to the equation:

$$\theta = m[I(0,\theta) - I(X,\theta)] + q,$$

where m and q are parameters correlated to the characteristics of the microelectronic device 50, including the geometry of the slit 70, the physical characteristics and efficiency of the photodiodes 71, as well as the intensity of the incident light beam, so that the proportionality parameters m, q vary from one device to another.

Consequently, according to an implementation of the microelectronic device 50, during testing of the device, the test machine controls the microelectronic device 50 so as to measure the light intensity detected by the array of photodetectors 71 for a plurality of angles θ of the platform 52 and calculates the distance XM at which the difference between the light intensity detected by the lateral photodetectors 71B and the light intensity detected by the central photodetector 71A depends directly upon the rotation angle θ. In this step, also the parameters m, q of the specific linear function [2] that links the difference of intensity to the angle θ are obtained. The distance XM and the parameters m, q are saved to a suitable memory area of the processing unit 75.

Thus, in use, the processing unit 75 may acquire just the brightness values measured by the central photodetector 71A and by one lateral photodetector 71B arranged at distance XM, compute their difference via the subtractor 76 of FIG. 4 and, on the basis of the previously calculated parameters, obtain the instantaneous angle θ. This instantaneous angle value θ may then be processed by the processing unit 75 or supplied to other units for precise feedback control of the angular position of the platform 52.

Since, with the array of photodetectors 71 of FIG. 5 at least two lateral photodetectors 71B are arranged at distance XM, it is possible to use both signals supplied by them and compute an average thereof that is used for the subtraction, or use the signal supplied by just one of them.

According to a different simplified implementation, the distance XM may be calculated statistically on a production lot, for example on a test device, and this value be used for all the devices of the lot, without searching distance XM for each device.

Figure 9:
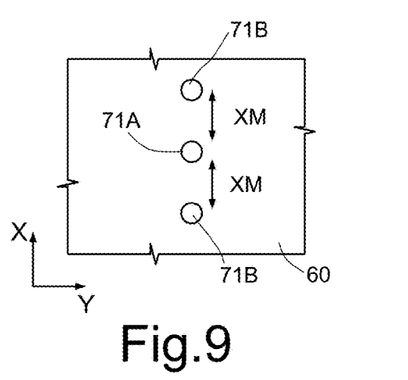
FIGS. 9-12 show different configurations of arrays of photodetector elements of the device of FIG. 4.
Figure 10:
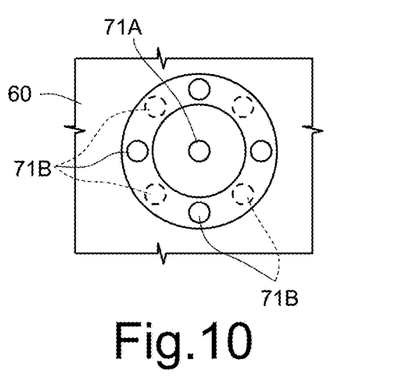
Figure 11:
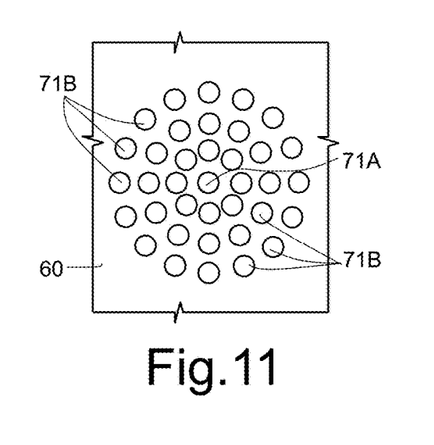
Figure 12:
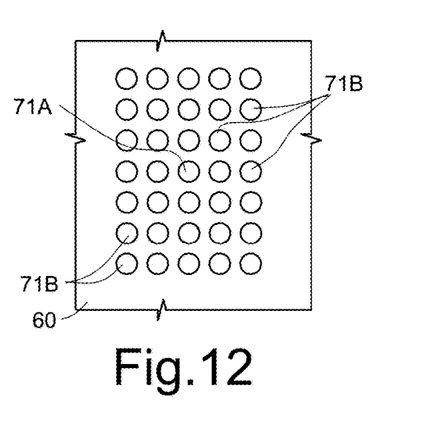

According to a different implementation, the distance XM may be calculated statistically on test structures during the design stage, and the device may comprise an array of photodiodes formed only by the central photodetector 71A and one or more photodetectors 71B arranged statistically at optimal distance XM or at a short distance therefrom. For example, the array of photodiodes may comprise just three photodiodes, arranged as shown in FIG. 9, or the lateral photodetectors 71B may be arranged within an annular area of the top surface 53A of the cavity 53, centered on the central photodetector 71A, as shown schematically in FIG. 10. In this case, according to the dimension of the annular area, during testing it is possible to look for the precise distance XM for each specific device or not.

In general, the arrangement of the photodetectors 71 may be chosen on the basis of various considerations, such as the fact that the platform 52 is rotatable about one or two axes. In the latter case, for example, the photodetectors 71 may be arranged according to a two-dimensional configuration, for example according to a rectangular, square or circular array, as shown schematically in FIGS. 11 and 12, or according to any other suitable shape, for example an oval, a polygon, annular sectors, etc. In any case, a two-dimensional (quadrangular, circular, or annular) configuration may be chosen also when the platform is rotatable about a single axis.

In a further embodiment, the processing unit 75 may comprise logic for calculating the distance XM and, in use, verifying, periodically or upon command, whether the optimal distance XM has been modified due to structural deformations, and using the new distance value XM.

Figure 13:
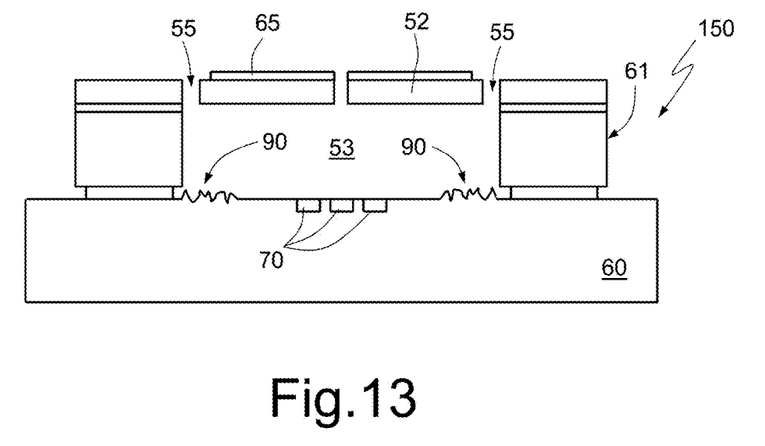
FIG. 13 is a cross-section of a different embodiment of the present MEMS device.

FIG. 13 shows a micro-electro-mechanical device 150 in which the top surface 53A of the cavity 53 has an anti-reflecting structure 90. Here, the anti-reflecting structure is formed outside the area of the photodetectors 71, near the periphery of the top surface 53A, underneath the trench 55.

The anti-reflecting structure 90 may be formed by depositing a stack of different dielectric layers or by forming a roughness of the top surface 53A, for example by silicon etch, in a known manner.

In this way, any possible light filtering within the cavity 53 through the trench 55 is randomly scattered and absorbed in a practically uniform way, without creating any possible reflections focused on specific photodetectors 71, such as to generate spurious signals.

The micro-electro-mechanical devices 50, 150 may be manufactured by wafer-to-wafer bonding at the front-end level, and subsequent sawing into single devices. Alternatively, they may be manufactured as SoC (System-on-Chip), by assembling a MEMS structure on a chip of photodetectors.

The slit 70 may be formed by DRIE (Deep Reactive Ion Etching), for example in the same step as, or in a step separate from, definition of the platform 52 and of the actuation structures, or in general of the micro-electro-mechanical structure.

The micro-electro-mechanical device 150 may thus be manufactured using micromachining techniques that are standard in the semiconductors industry, with costs that are not high and with a good reliability.

The micro-electro-mechanical device 50, 150 may be used in a picoprojector 101 designed to be functionally coupled to a portable electronic apparatus 100, as illustrated hereinafter with reference to FIGS. 14-16.

Figure 14:
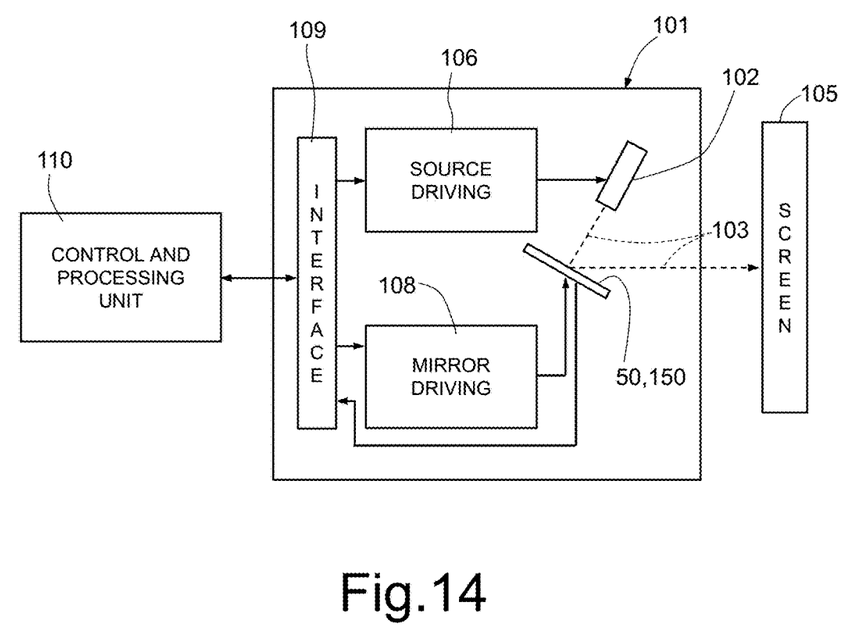
FIG. 14 is a block diagram of a picoprojector using the present MEMS device.

In detail, the picoprojector 101 of FIG. 14 comprises a light source 102, for example of a laser type, designed to generate a light beam 103; the micro-electro-mechanical device 50, 150, designed to receive the light beam 103 and direct it towards a screen or display surface 105 (external and arranged at a distance from the picoprojector 101); a first driving circuit 106, designed to supply appropriate control signals to the light source 102, for generating the light beam 103 according to an image to be projected; a second driving circuit 108, designed to supply driving signals for rotating the platform 52 (FIGS. 4 and 13) of the micro-electro-mechanical device 50, 150; and a communication interface 109, designed to receive, from an external control unit 110, for example included in the portable apparatus 100 (FIGS. 9, 10), light information on the image to be generated, for example in the form of an array of pixels. The light information is inputted for driving the light source 102.

Further, the control unit 100 may comprise a unit for controlling the angular position of the mirror of the micro-electro-mechanical device 50, 150. To this end, the control unit 100 may receive the signals generated by the photodetectors 71 (not represented in FIG. 14) through the interface 109 and accordingly control the second driving circuit 108.

Figure 15:
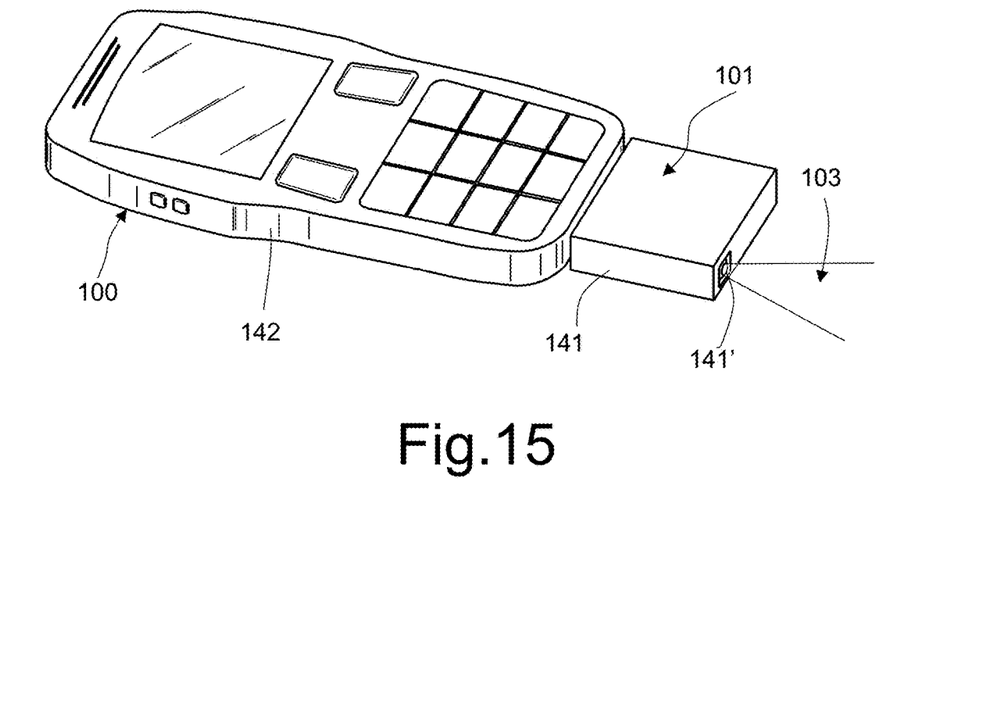
FIGS. 15 and 16 show coupling variants between the picoprojector of FIG. 10 and a portable electronic apparatus.

The picoprojector 101 may be formed as separate stand-alone accessory with respect to an associated portable electronic apparatus 100, for example a cellphone or smartphone, as shown in FIG. 15. In this case, the picoprojector 101 is coupled to the portable electronic apparatus 100 by suitable electrical and mechanical connection elements (not illustrated in detail). Here, the picoprojector 101 has an own housing 141, which has at least one portion 141' transparent to the light beam 103 coming from the microelectronic device 50. The housing 141 of the picoprojector 1 is releasably coupled to a respective housing 142 of the portable electronic apparatus 100.

Figure 16:
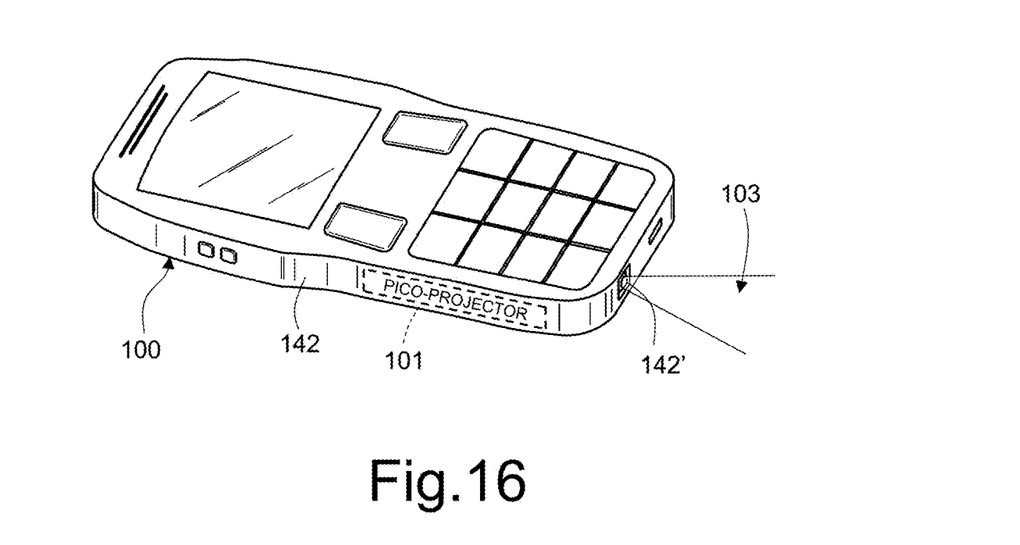

Alternatively, as illustrated in FIG. 16, the picoprojector 101 may be integrated within the portable electronic apparatus 100 and be arranged within the housing 142 of the portable electronic apparatus 100. In this case, the portable electronic apparatus 100 has a respective portion 142' transparent to the light beam 103 coming from the micro-electro-mechanical device 50, 150. The picoprojector 101 is, in this case, for example coupled to a PCB (printed-circuit board) inside the housing 142 of the portable electronic apparatus 100.

Finally, it is clear that modifications and variations may be made to the device and to the control method described and illustrated herein, without thereby departing from the scope of the present disclosure. For example, the various described embodiments may be combined for providing further solutions. The photodetectors may be manufactured in any suitable way.

Further, the slit 70 could be arranged in a non-central position. For example, it could be arranged in another point of the platform 52, arranging the photodetectors 71 accordingly. A further slit could be arranged for detecting a further degree of freedom. For example, for a micromirror with two degrees of freedom and a structure similar to the one represented in FIG. 3, a further slit could be made in the frame 13. In this case, underneath the further slit photodetectors may be arranged with very high sensitivity so that the little light intercepted by the further slit would enable detection of the movement of the micromirror according to a second degree of freedom.

The antireflecting portion could be arranged on the side wall of the cavity 53.

The substrate 60 could be made of a different material, for example not a semiconductor material, such as a PCB, carrying a chip integrating the array of photodetectors, thus using an assembly technology.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A micro-electro-mechanical device, comprising:
a platform configured to rotate by a rotation angle ($\theta$);
a slit in the platform;
a support structure supporting the platform and including a cavity facing a first side of the platform; and
a plurality of integrated photodetectors facing the cavity and the first side of the platform;
wherein the slit has a center, and the plurality of photodetectors comprises a first photodetector and a second photodetector arranged adjacent to a bottom wall of the cavity facing the platform, the first and second photodetectors being arranged at different distances from a vertical line passing through the center of the slit and perpendicular to the bottom wall; and
wherein the first and second photodetectors are configured to generate first and second light-intensity signals, respectively, the device further comprising a processing unit configured to receive the first and second light-intensity signals from the first photodetector and the second photodetector, respectively, the processing unit include a subtractor configured to generate a difference signal between the first light-intensity signal and the second light-intensity signal and a computing unit configured to calculate the rotation angle of the platform based on the difference signal.

2. The device according to claim 1, wherein said first photodetector is arranged along the vertical line, and said second photodetector is spaced apart from the vertical line.

3. The device according to claim 1, wherein the computing unit is configured to calculate the rotation angle ($\theta$) of the platform based on the equation:

$$\theta = m[I(0,\theta) - I(X,\theta)] + q,$$

where m and q are stored parameters, correlated to characteristics of the device, and X is a distance of one of the photodetectors from a vertical line passing through a center of the slit and perpendicular to a bottom wall of the cavity facing the platform.

4. The device according to claim 1, wherein the plurality of photodetectors comprises an array of photodetectors arranged in a configuration chosen from a straight line, a quadrangle, a circle, a polygon, an oval, an annular shape, and an annular sector.

5. The device according to claim 1, wherein the support structure includes a first substrate and a second substrate bonded together, wherein the first substrate has a top surface facing the second substrate and forms a bottom wall of the cavity, the plurality of photodetectors being integrated in or on the first substrate; the first or the second substrate including carrying walls laterally delimiting the cavity and including semiconductor material.

6. The device according to claim 5, comprising an antireflecting structure within the cavity and on the bottom wall or on the carrying walls.

7. The device according to claim 1, wherein the slit has dimensions comprised between 1 µm×10 µm and 5 µm×50 µm.

8. The device according to claim 1, wherein the platform includes a center, along the rotation axis, and the slit is arranged at the center of the platform.

9. The device according to claim 1, wherein the device is a micromirror and includes a reflective surface on the platform.

10. The device according to claim 5, wherein the second substrate includes a bottom semiconductor layer and a top semiconductor layer separated by an insulating layer, and the top semiconductor layer is substantially coplanar with the platform at respective upper surfaces and bottom surfaces thereof.

11. The device according to claim 10, wherein the top semiconductor layer is separated from the platform by a circular gap.

12. The device according to claim 1, wherein the support structure includes an arm, a torsion spring and an actuation structure, all substantially at a same level as the platform.

13. The device according to claim 1, wherein the processing unit is further configured to calculate the rotation angle of the platform based on a number of the plurality of integrated photodetectors that detect light.

14. A picoprojector, comprising:
a micro-electro-mechanical device that includes:
a platform configured to rotate by a rotation angle ($\theta$);
a slit in the platform;
a support structure supporting the platform and including a cavity facing a first side of the platform; and
a plurality of integrated photodetectors facing the cavity and the first side of the platform, and configured to generate light-intensity signals;
a light source facing a second side of the platform and configured to generate a light beam; and
a processing unit configured to receive the light-intensity signals from the plurality of photodetectors and calculate the rotation angle of the platform based on the light-intensity signals, wherein:
the slit has a center;
the plurality of photodetectors comprises a first photodetector and a second photodetector arranged on a bottom wall of the cavity, facing the platform, the first and second photodetectors being arranged at different distances from a vertical line through the center of the slit and being configured to generate a first light-intensity signal and a second light-intensity signal, respectively; and
the processing unit is configured to receive the first and second light-intensity signals and generate a difference signal from the first and second light-intensity signals and calculate the rotation angle of the platform based on the difference signal.

15. The picoprojector according to claim 14, wherein the processing unit is configured to calculate the rotation angle ($\theta$) of the platform based on the equation:

$$\theta = m[I(0,\theta) - I(X,\theta)] + q,$$

where m and q are stored parameters, correlated to characteristics of the device, and X is a distance of one of the photodetectors from a vertical line passing through a center of the slit and perpendicular to a bottom wall of the cavity facing the platform.

16. The picoprojector according to claim 14, wherein the support structure includes a first substrate and a second substrate bonded together, wherein the first substrate has a top surface facing the second substrate and forms a bottom wall of the cavity, the plurality of photodetectors being integrated in or on the first substrate; the first or the second substrate including carrying walls laterally delimiting the cavity and including semiconductor material.

17. The picoprojector according to claim 14, wherein the micro-electro-mechanical device is a micromirror and includes a reflective surface on the platform.

18. A method, comprising:
detecting rotation of a rotatable platform of a micro-electro-mechanical device that includes a platform configured to rotate by a rotation angle ($\theta$), a slit in the platform, a support structure supporting the platform and including a cavity facing a first side of the platform, and a plurality of integrated photodetectors facing the cavity and the first side of the platform, the detecting including:
sending a light beam onto a second side of the platform;
detecting, by the photodetectors, a portion of the light beam passing through the slit in the platform;
producing, by the photodetectors, electrical signals correlated to a light intensity of the portion of the light beam detected by the photodetectors; and
processing the electrical signals to obtain the rotation angle of the platform wherein:
the photodetectors include first and second photodetectors;
the producing the electrical signals comprises the first photodetector producing a first light-intensity signal and the second photodetector producing a second light-intensity signal; and
the processing the electrical signals comprises generating a difference signal from the first and second light-intensity signals and calculating the rotation angle of the platform based on the difference signal.

19. The method according to claim 18, wherein processing the electrical signals comprises calculating the rotation angle of the platform on the basis of the equation $$\theta = m[I(0,\theta) - I(X,\theta)] + q,$$

where m and q are stored parameters, correlated to characteristics of the device, and X is a distance of one of the photodetectors from a vertical line passing through a center of the slit and perpendicular to a bottom wall of the cavity facing the platform.

20. The method according to claim 18, comprising
sending a plurality of setting light beams onto the second side of the platform, each setting light beam being sent at a different respective rotation angle of the platform;
detecting, by the photodetectors, portions of the setting light beams passing through the slit;
generating a plurality of sets of electrical signals by the photodetectors, each set of electrical signals being associated with a different known rotation angle of the platform and each set of electrical signals including at least three electrical setting signals generated by respective photodetectors that are aligned with each other and at different distances from the platform;
calculating linearity indices as squares of amplitude differences of the electrical setting signals; and
selecting a pair of photodetectors supplying maximum linearity indices as a first measure photodetector and second measurement photodetector that are used for subsequent detection of unknown rotation angles.

* * * * *